United States Patent
Boden, Jr. et al.

(10) Patent No.: US 6,380,004 B2
(45) Date of Patent: Apr. 30, 2002

(54) PROCESS FOR MANUFACTURING RADHARD POWER INTEGRATED CIRCUIT

(75) Inventors: Milton John Boden, Jr.; Iulia Rusu, both of Redondo Beach; Niraj Ranjan, El Segundo, all of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/774,572

(22) Filed: Feb. 1, 2001

Related U.S. Application Data

(60) Provisional application No. 60/179,843, filed on Feb. 2, 2000.

(51) Int. Cl.[7] .......................................... H01L 21/332
(52) U.S. Cl. ...................... 438/138; 438/212; 438/268; 438/953
(58) Field of Search ................................ 438/268, 290, 438/212, 206–209, 137–138, 953

(56) References Cited

U.S. PATENT DOCUMENTS

| | | | |
|---|---|---|---|
| 5,023,678 A | 6/1991 | Kinzer | 357/23.4 |
| 5,037,781 A | * 8/1991 | Woodruff et al. | |
| 5,338,693 A | 8/1994 | Kinzer et al. | 437/29 |
| 5,485,027 A | * 1/1996 | Williams et al. | 257/343 |
| 5,831,318 A | 11/1998 | Spring et al. | 257/402 |
| 6,165,821 A | 12/2000 | Boden, Jr. et al. | 438/137 |

OTHER PUBLICATIONS

K.A. LaBel et. al; "Single Event Effect Characteristics of CMOS Devices Employing Various Epi–layer Thicknesses"; pp. 1–5. http://flick.gsfc.nasa.gov/radhome/papers/CMOS_Epi_95.pdf.

* cited by examiner

Primary Examiner—Jey Tsai
(74) Attorney, Agent, or Firm—Ostrolenk, Faber, Gerb & Soffen, LLP

(57) ABSTRACT

A high voltage radiation hardened power integrated circuit (PIC) with resistance to TID and SEE radiation effects for application in high radiation environments, such as outer space. TID hardness modification include forming gate oxide layers after high temperature junction processes, adding implant layers to raise the parasitic MOSFET thresholds with respect to native thresholds, and suppressing CMOS drain-to-source and intrawell transistor-to-transistor leakage. In addition, radhard field oxide is utilized. SEE ruggedness is improved by reducing the epi thickness over that of non-radhard devices, and increasing the epi concentration near the substrate junction. A radhard PIC rated to 400 V and capable of operating at 600 V or more is provided. The inventive PIC can withstand 100 krads of TID and a heavy ion Linear Energy Transfer of 37 MeV/(mg/cm$^2$) at full rated voltage.

16 Claims, 5 Drawing Sheets

PROCESS FOR MANUFACTURING RADHARD POWER INTEGRATED CIRCUIT

This application claims the benefit of U.S. Provisional application Ser. No. 60/179,843, filed Feb. 2, 2000.

BACKGROUND OF THE INVENTION

1. Field of the Invention

The present invention relates to radiation hardened ("radhard") power integrated circuits which have improved resistance to damage by large (megarad) doses of ionizing radiation, or by single or plural event high energy charged particles.

2. Brief Description of the Related Art

Power integrated circuits (PICs) are well known in the prior art. PICs typically include circuitry for controlling MOS-gated power transistors. In some PICs, the MOS-gated power transistors are integrated into the same silicon that carries the control circuitry. A typical PIC of this type is the IR2112 PIC made by the International Rectifier Corporation.

The PICs like most electronic devices, do not function well in a high radiation environment, such as in outer space. The effects of ionizing radiation can accumulate over time, resulting in device degradation. Also, heavy ion strikes can lead to catastrophic failure. When power devices are employed in such environments, the devices are typically more susceptible to these problems because of their large depletion volumes and large device areas. Power MOS-gated devices specifically designed for use in radiation-rich environments, commonly termed radhard devices, are well known. Such devices are described in U.S. Pat. Nos. 5,338,693; 5,831,318; and 6,165,821 which are assigned to the assignee of the present application. The design rules for such radhard devices are quite different from those of conventional MOS-gated devices, such as power MOSFETs, IGBTs MOSgated thyristors and the like. These different design rules arise to ensure the continued operation of the MOS-gated device in an ionizing radiation environment. The design rules generally call for the use of the thinnest possible gate oxide (for example, about 700 to 900 Å for a 400 volt reverse breakdown device) to minimize threshold voltage shift in the presence of a high radiation background. A "late gate" process sequence is also employed which reduces the exposure of the gate oxide to high temperature process steps. It would be desirable to provide a radhard PIC that utilizes the above-noted design features and can function in a high radiation environment.

SUMMARY OF THE INVENTION

The present invention overcomes the deficiencies in the prior art, such as those described above, by providing a "radhard" PIC (that is, a PIC that can operate in a high radiation environment). A discussion of radiation resistance in electronic devices as it relates to total dose and single event considerations is provided in U.S. Pat. No. 6,165,821 issued Dec. 26, 2000, the entire disclosure of which is incorporated herein by reference.

The PIC of the present invention includes a latch-up immune 20V CMOS and a 600V LDMOS. The novel device provides high voltage operation that can control loads of, for example, about 400 volts to at least 600 volts. Using the novel production process in which gate oxides are formed late in the process, the gate oxides are not exposed to high temperature processing steps, making the devices less susceptible to damage in high ionizing radiation environments. A high voltage, junction isolation (HVJI) process is used. The HVJI process is disclosed in U.S. Pat. No. 5,023,678 issued Jun. 11, 1991, the entire disclosure of which is incorporated herein by reference.

A preferred process for manufacturing a radiation hardened power integrated circuit according to the present invention includes steps for enhancing TID and SEE capabilities.

Enhanced TID hardness is provided by forming gate oxides late in a high voltage, junction isolation process so as to avoid exposing the gate oxides to high temperature processing steps. In addition, two implant layers are included in the CMOS to raise the parasitic MOSFET thresholds with respect to native thresholds. Preferably, a radhard field oxide is provided as well. The layout of the device accounts for these processes and suppresses CMOS drain to source and intra-well transistor-to-transistor leakage, in particular with respect to polygate to field oxide overlap and individual ringing of CMOS devices with channel adjust layers.

SEE ruggedness is provided by a reduced epi thickness and increased epitaxial layer (epi) concentration near the substrate junction. Accordingly, the device has reduced charge collection volume and reduced parasitic bipolar gain, which in turn provides a reduced chance of a single event latch-up condition after a heavy ion strike. The increase epi concentration near the substrate junction also has the added benefit of truncating charge funneling effects in the silicon.

The PIC thus produced demonstrates total ionizing dose (TID) capabilities of at least 100 krads, and single event effects (SEE) capabilities in terms of linear energy transfer coefficient (LET) of at least 37 MeV/(mg/cm$^2$) at full rated voltage.

DETAILED DESCRIPTION OF THE PREFERRED EMBODIMENTS

Figure 1:
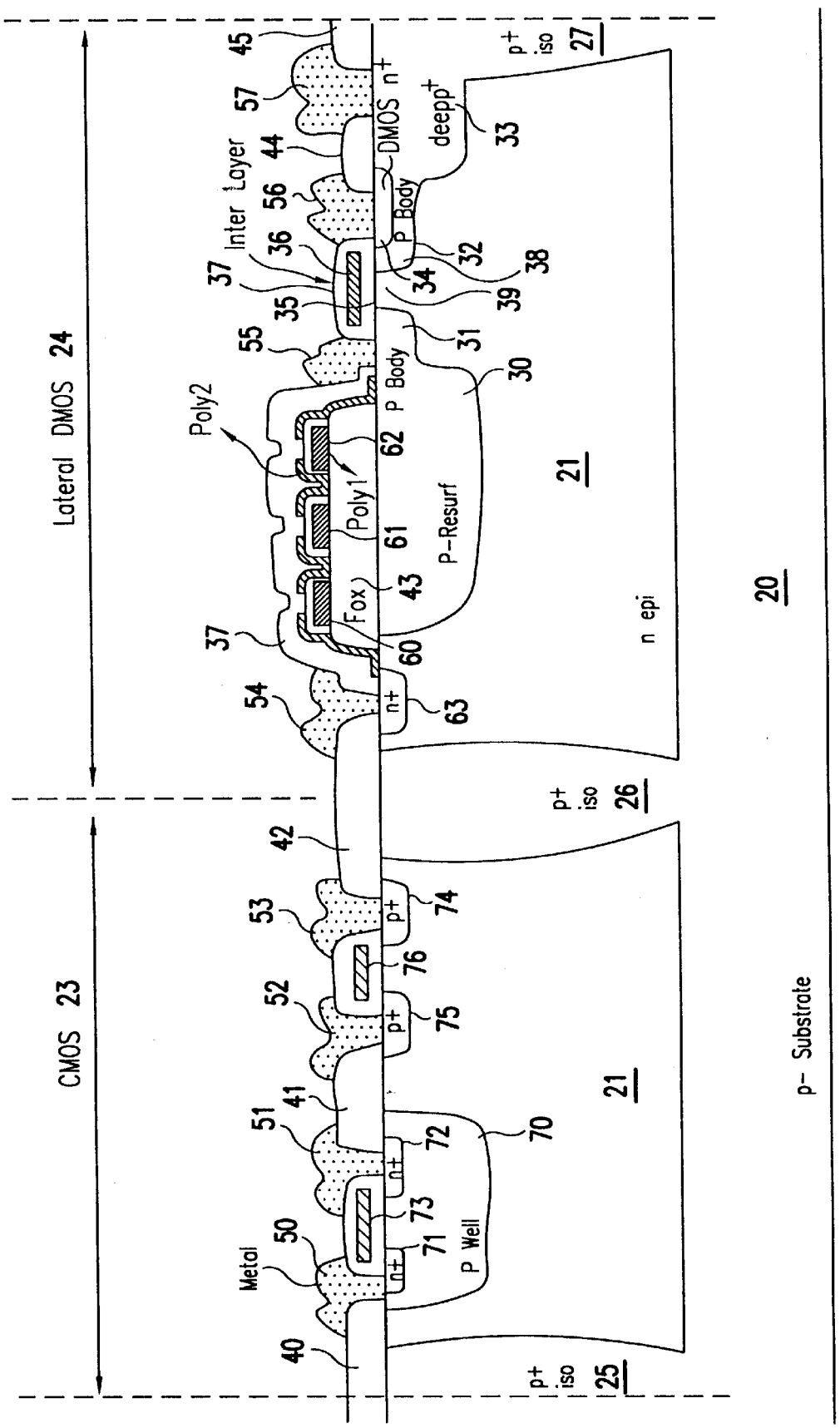
FIG. 1 is a schematic cross-section through the final HVJI PIC chip of the present invention, showing a high voltage lateral DMOS section and a CMOS control section integrated into the same chip.

Referring initially to FIG. 1, a preferred embodiment of the device made by the novel process is shown in cross-section. The illustrated device is a 600 V capable version of the industry standard IR2110 power MOSFET gate driver, which is a high voltage driver with independent high and low side output channels.

In FIG. 1, only a small fraction of the silicon is shown, but it will be seen that a common P⁻ substrate 20 has an epitaxially formed layer 21 on top. Layer 21 is divided into a CMOS control segment 23 and a lateral power DMOS segment 24 by P⁺ isolation sinkers 25, 26, 27. As will be later described, epitaxial layer 21 is divided into top and bottom segments.

The lateral DMOS structure 24 includes a P⁻ resurf region 30, spaced P body regions 31 and 32, and a deep P⁺ body 33. An N⁺ DMOS source region 34 formed in P body 32 is spaced inwardly from the edge to create an N channel region 38. A gate oxide 35, a polysilicon gate 36 and interlayer oxide 37 overlies N channel region 38 and the space between P body regions 31 and 32 defining P channel region 39.

The top surface of the silicon chip is covered by field oxide segments 40–45. Aluminum contacts 50–57 are connected to the silicon as shown, and spaced polysilicon strips 60, 61 and 62 (parts of the poly 1 layer) are deposited on field oxide layer 43 to form field plate capacitors. Strips 60, 61 and 62 are covered by interlayer oxide and a second poly layer, poly 2 covers the insulated poly 1 strips 60, 61 and 62 to form a high voltage termination. An N⁺ diffusion 63 provides the DMOS drain contact 54.

The CMOS structure 23 includes a P well 70 which contains N⁺ diffusions 71, 72, with an overlying polysilicon gate 73, forming an N channel MOSFET. P⁺ diffusions 74 and 75, with overlying polysilicon gate 76, form a P channel MOSFET.

The output of the CMOS section 23 is internally connected to the lateral DMOS device 24 to control its operation in any desired manner. Obviously, any number of CMOS segments 23 may be provided and interconnected to form any desired control, and segment 23 is only illustrative of one typical CMOS element.

The novel manufacturing process is next described by way of a specific example. Variations and other process flows that can be used will be obvious to those of skill in the art based on their understanding of the present invention. Also, those of skill in the art will know that although only a few single devices are shown and discussed below as illustrative, a large number of devices will be formed on a common wafer that subsequently is diced to provide individual devices that are housed appropriately. Process parameters are approximate, and may be varied within a range of the value given based on process and material conditions without departing from the scope of the invention, as will be known to those of skill in the art. In the example below, routine steps such as pre-diffusion cleaning, baking, and washing, for example, generally have been left out of the description for the sake of brevity.

Figure 2:
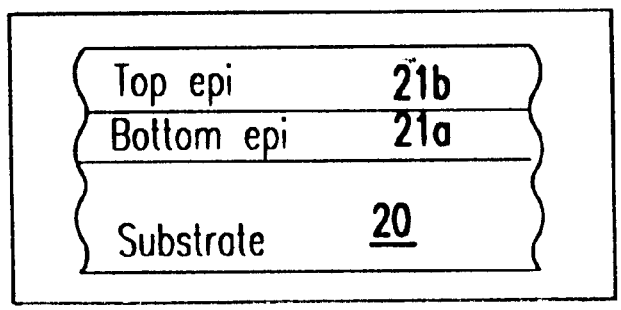
FIG. 2 is a cross-section showing a starting wafer at the beginning step of the process according to the present invention.

FIG. 2 shows a representative portion of the starting wafer consisting of the P substrate 20 which may be 40 ohm-cm., for example. The N epitaxial layer 21 consists of a bottom As-doped epi layer 21a which is 2 μm thick and 0.72 ohm cm., covered by a P-doped epi layer 21b which is about 8 μm thick, 3 ohm cm. Standard oxide growing processes may be utilized. The thickness of epi layer 21 is less than that of the typical non-radhard PIC of this type, such as the IR2112 PIC made by the International Rectifier Corporation, and the higher epi concentration near the substrate, provide a reduced charge collection volume and reduced parasitic bipolar gain.

Figure 3:
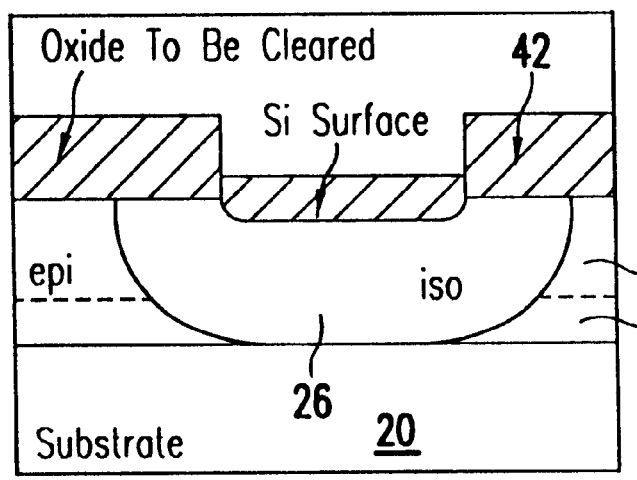
FIG. 3 illustrates the isolation block steps performed on the chip of FIG. 2.

Referring to FIG. 3, a block of steps is undertaken for creating P⁺-type isolation regions 25, 26 and 27, as illustrated for region 26 in particular, using a two-part diffusion process. Initially, isolation oxide 42 is grown to about 10,000 Å using any standard oxide growing process, for example. Then, an isolation mask is utilized to oxide etch openings above the areas where the P⁺ isolation regions are to be formed. A typical 6:1 BOE solution is utilized (Buffered oxide etch: 6:1 BOE=6 parts 40% NH₄F and 1 part 49% HF ).

Once the opening is provided, isolation capping oxidation takes place at about 900 ° C. for 20 minutes. The oxidation is performed wet to produce an approximately 600 Å capping layer, after which isolation regions, such as region 26 shown in FIG. 3, are pre-formed using boron ion implantation. The ion implantation step is carried out at an energy of approximately 50 KeV and a dose about 1.0E16 cm⁻², for example. The isolation region is diffusion driven for 120 minutes using N₂ at 1200° C. for 12 minutes, and wet at 1050° C. (2,500Å). The chip then is etched to clear all oxides (approx. 13 minutes).

Figure 4:
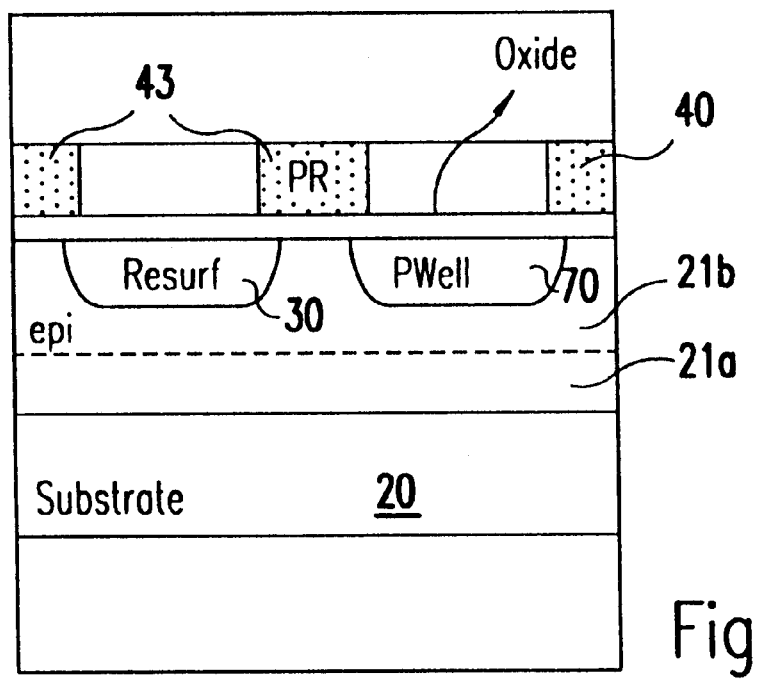
FIG. 4 illustrates the P well and resurf block formation steps performed on the chip of FIG. 3.

FIG. 4 schematically shows the formation of P well 70 and P resurf 30. Preferably, P well base oxidation takes place at 900° C. for 30 minutes, wet, to form an 800 Å layer, and a P well mask is applied. Implantation proceeds using boron ions at an energy level of about 80 keV and a dose of about 1.1E13 cm⁻². After the photoresist is stripped, a resurf mask is applied, and implantation of resurf region 30 takes place using boron ion implantation at an energy level of about 80 keV and a dose of 3.33E12 cm⁻². After another photoresist strip, the resurf and P well regions are diffusion driven at 1,200° C. for 280 minutes with N₂, and 40 minutes wet, preferably simultaneously growing an approximately 6,500 Å layer of oxide.

Figure 5:
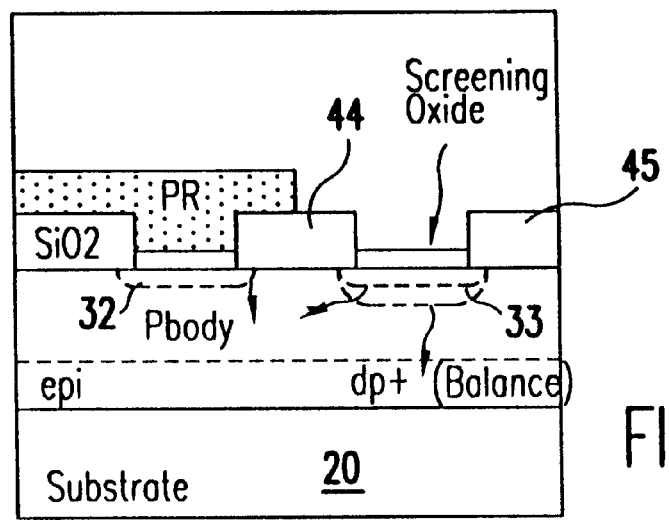
FIG. 5 illustrates the chip of FIG. 4 undergoing the steps of deep P+/body block formation according to the present invention.

The development of lateral DMOS 24 continues with the formation of P body 32 and deep P⁺ region 33 as illustrated in FIG. 5. A master mask is applied for the deep P⁺/P body, and a plasma descum process is performed to open both areas to oxide etching. The photoresist is stripped, etching 6500 Å oxide down to the silicon surface. Screening oxide is grown at 1050° C. for about 18 minutes, dry, to grow about a 300 Å layer. P body formation begins with boron ion implantation at an energy level of about 80 KeV and a dose of 7.8E13 cm². Then a P body protecting mask is applied, and deep P⁺ boron ion implantation takes place, again at an energy of about 80 KeV, and with a dose of 2.5E14 cm⁻². After resist ash treatment and hot pot stripping, P body 32 and deep P⁺ region 33 are driven at 1175° C. for 90 minutes using N₂.

Figure 6:
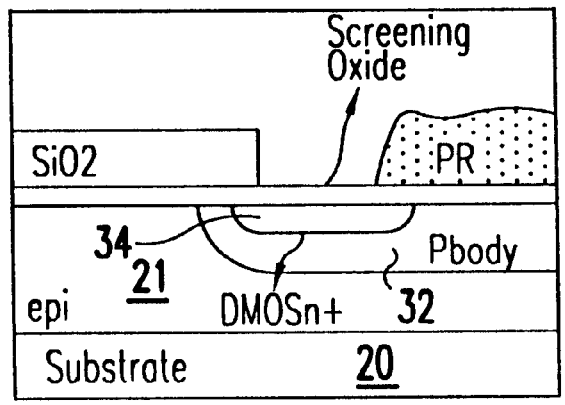
FIGS. 6 and 7 show the steps of DMOS NPLUS, PCH and NCH field adjust block formation having been performed on the chip of FIG. 5.
Figure 7:
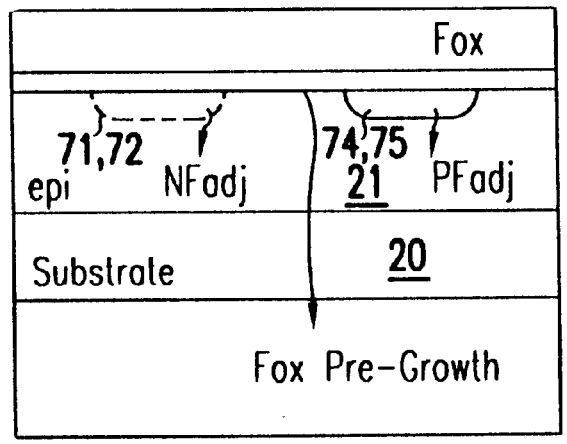

The next block of steps in formation of the lateral DMOS is illustrated in FIGS. 6 and 7, in which source 34, and the P channel and N channel field adjust layers of the CMOS, are provided. The CMOS field adjust layers raise the parasitic MOSFET thresholds with respect to the native thresholds.

The process proceeds by applying a DMOS N⁺ mask to open the N⁺ region in the DMOS area only. Then, DMOS N⁺ region 34 is formed using arsenic ion implantation at an energy of about 120 KeV and a dose of 5.0E15 cm². The newly-formed DMOS N⁺ region is annealed at 975° C. for 120 minutes (N₂). Then, buffered oxide etching clears all oxides (clears 6,500 Å oxide). A screening oxide layer preferably is formed, for example, as pre-grown field oxide produced at 900° C. for 30 minutes, under wet conditions to a thickness of about 800 Å.

Referring to FIG. 7, initial formation of CMOS 23 proceeds by applying a p-channel field adjust mask, and p-channel field adjust phosphorus implantation takes place at an energy level of about 120 KeV, and a dose of about 4E13 cm$^{-2}$, to form parasitic transistor channels 74, 75. Following hot pot stripping, the n-channels 71, 72 are formed using an adjust mask and boron ion implantation at an energy level of about 50 KeV and a dose of about 8E13 cm$^2$. Stripping and pre-diffusion cleaning (no HF) precede field oxide ($F_{ox}$) deposition using undoped TEOS (Tetraethoxysilan, Tetraethylorthosilicate) to deposit approximately a 7,200 Å layer. This results in a field oxide having a total thickness of 8000 Å.

Figure 8:
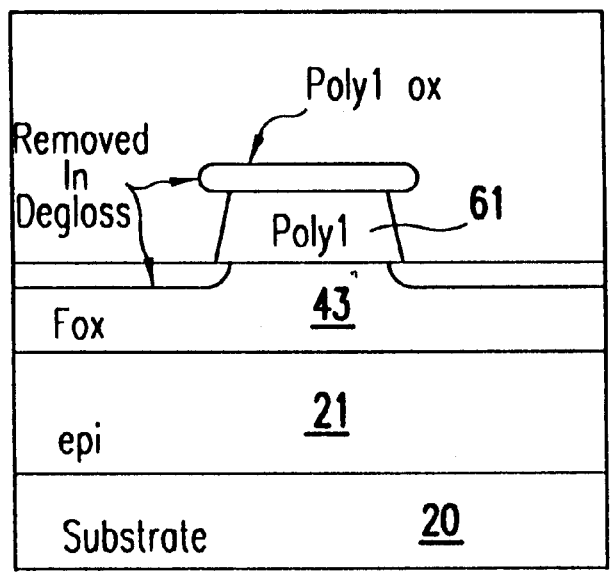
FIG. 8 illustrates formation of the Poly 1 block on the chip of FIG. 7.

FIG. 8 illustrates the block of steps used to form the resistor strip 61, for example, of the poly 1 layer of FIG. 1 in lateral DMOS 24. Directly following the previous deposition of $F_{ox}$ layer 43, the process proceeds with formation of the poly 1 layer using LPCVD (low pressure chemical vapor deposition) to deposit an undoped layer about 7,500 Å in thickness. Resistor strip 61 is implanted using boron ion implantation at an energy level of about 80 KeV and a dose of about 3.6E14 cm$^2$. Following pre-diffusion cleaning, poly 1 oxidation takes place at 900° C., for 15 minutes, wet, to form a layer of about 450 Å in thickness. Subsequently, a mask is applied and oxide etching (6:1 BOE, photoresist strip, 75 seconds) is utilized to form a protective poly oxide layer over resistor strip 61. This is followed by a wet sink etch of the exposed poly 1 layer and oxide degloss in 100:1 HF for 600 seconds, which removes the oxide ledge. The Poly 1 layer is driven and interpoly oxide is grown at about 975° C. for 60 minutes using N$_2$, and for 80 min. wet to grow about 6,000 to 6,500 Å on the poly 1 layer.

Figure 9:
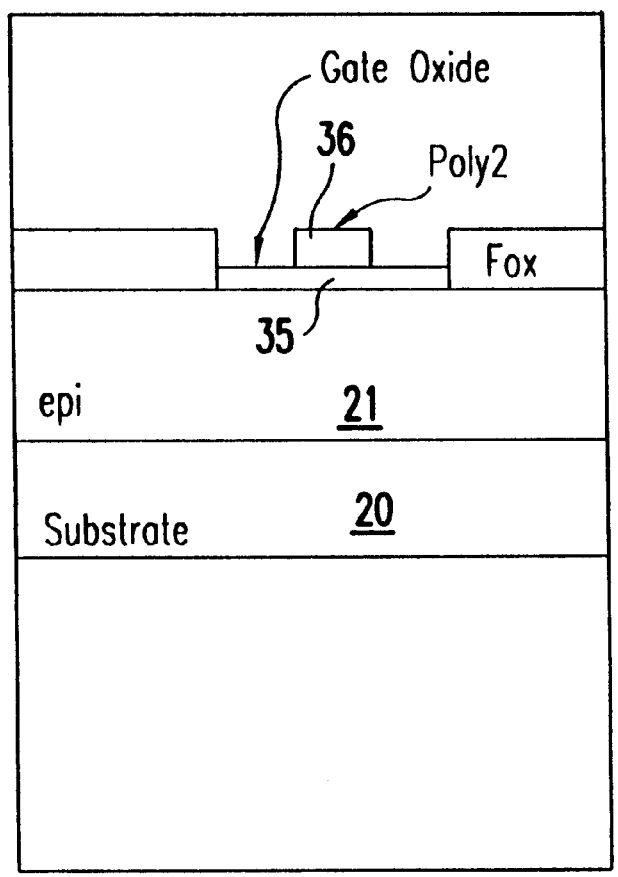
FIG. 9 illustrates formation of the active area and the gate polysilicon block on the chip of FIG. 8.

The active area and gate polysilicon 36 of lateral DMOS 24 are produced using process steps illustrated in FIG. 9. Initially, the active area is opened using a mask, and oxide etching is performed (6:1 BOE; 11 min., 45 secs). Following the photoresist strip and pre-diffusion cleaning (etching $F_{ox}$ and interpoly oxide to Si), sacrificial gate oxide is grown at 900° C., and pushed in 750° C., 15 min., O$_2$ (approx. 100 Å). A sacrificial gate oxide blanket etch is performed, and gate oxide is grown at 900° C., and pushed in at 750° C., 28 min. wet (800 Å). In-situ doped gate poly 2 is provided by LPCVD deposition to a thickness of about 5,000 Å. The poly 2 implant is generated next using phosphorus at an energy level of about 80 KeV and a dosage of about 1E16 cm$^{-2}$. A gate poly 2 mask is applied, and poly 2 is dry etched. A photoresist strip completes this processing block of steps.

Figure 10:
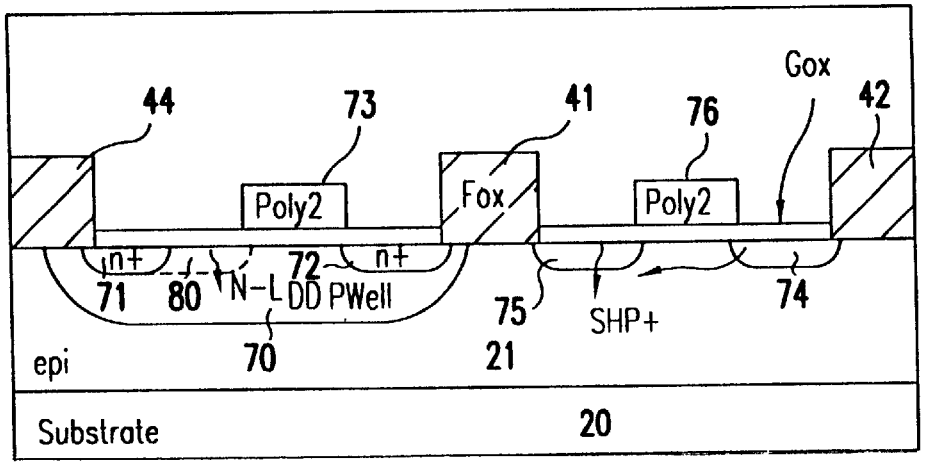
FIG. 10 shows the chip of FIG. 9 after the next block of steps used to define the NMOS N$^+$ regions, the N-L$_{DD}$ region, and the SHP$^+$.

FIG. 10 shows the next block of steps used to define the NMOS N$^+$ regions 71, 72; the N-L$_{DD}$ region 80, and the SHP$^+$ of CMOS 23. These steps begin with application of a mask and implantation of the NMOS N$^+$ implant: Phosphorous ion (P$^+$), at an energy level of about 80 KeV and a dose of about 5.0E15 cm$^{-2}$. After ash and wet photoresist strip, blanket N-LDD implantation is performed at an energy level of about 120 KeV, with a dose of about 5.0E12 cm$^{-2}$. Then, the SHP$^+$ mask is applied, and SHP$^+$ implantation takes place using boron ion (B$^+$) implantation at an energy level of about 50 KeV and a dose of about 5.0E14 cm$^{-2}$. Photoresist strip completes this process block.

Figure 11:
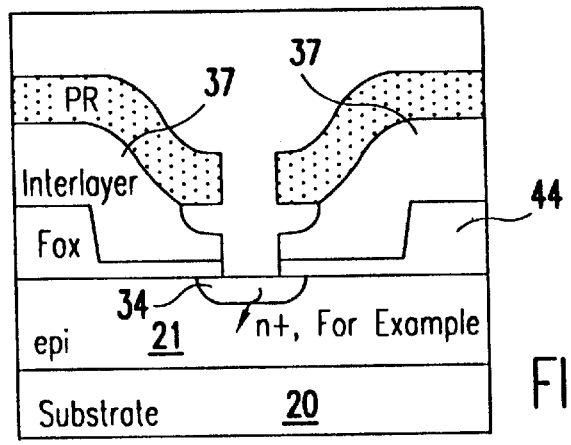
FIG. 11 shows the block of FIG. 10 after formation of the interlayer oxide and contact openings.

FIG. 11 illustrates the next block of steps used to form the interlayer oxide and contact openings. Initially, the wafer is pre-diffusion cleaned using no HF. Then, undoped TEOS is deposited to a thickness of about 15,000 Å, and the poly 2 layer is driven in at about 900° C. for about 60 minutes under nitrogen. A contact mask is applied, and the oxide is wet etched (6:1 BOE, 2 mins., 30 secs) to approximately 8,000 Å and dry etched to silicon.

Figure 12:
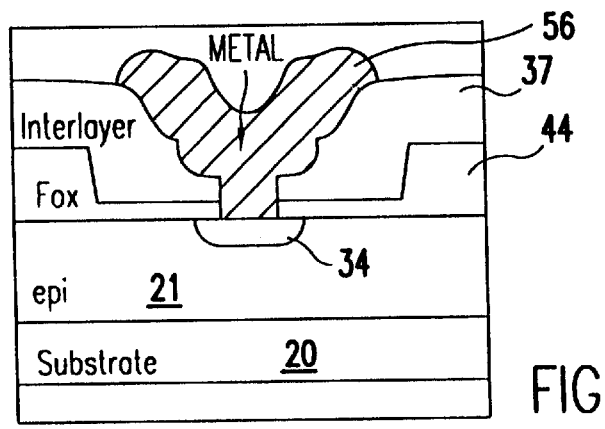
FIG. 12 shows formation of metal features on the block of FIG. 11.

The block for formation of metal contacts is illustrated in FIG. 12. Following a pre-metal cleaning, aluminum sputtering is used to coat the top surface of the PIC with a layer about 20,000 Å thick of aluminum with 1% silicon. A metal mask is applied, and a wet aluminum sink etch at about 50° C. is used to provide metal contacts 50–57. A photoresist strip and wet defreckle complete this block.

To complete the PIC device, a passivation block of steps is carried out, consisting of the following steps (not shown): First, a post aluminum clean takes place, followed by LPCVD oxide deposited at about 405° C., 2–4% PHOS doped to a thickness of about 15,000 Å. A pad mask is applied, which is followed by a sink pad etch. Photoresist strip completes the device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A process for the manufacture of a power integrated circuit having improved total dose resistance and resistance to single event failure, the process comprising the steps of forming gate oxides after forming diffusion regions in an active area of a voltage junction isolation process so as to avoid exposing the gate oxides to implant diffusion processing steps to provide a power integrated circuit for use in high ionizing radiation environments.

2. The process of claim 1, further comprising the step of forming field oxides after forming high temperature diffusions in a high voltage junction isolation process so as to avoid exposing the field oxides to high temperature processing steps.

3. The process of claim 1, further comprising the steps of:
   forming an epitaxial layer on an upper surface of a substrate, the epitaxial layer being separated into a control segment and a power segment by an isolation region;
   introducing a resurf region and a separate body in the power segment;
   providing control diffusions in the control segment;
   forming a layer of gate insulation on the control segment and on the power segment; and
   forming gate electrodes over layer of gate insulation and on the control segment and the power segment.

4. The process of claim 3, wherein the step of forming the epitaxial layer comprises forming a bottom epitaxial layer covered by a top epitaxial layer, the bottom layer having an increased charge concentration over that of the top epitaxial layer.

5. The process of claim 4, wherein the bottom epitaxial layer is As-doped, and the top epitaxial layer is P-doped.

6. The process of claim 3, wherein the thickness of the epitaxial layer is less than that of non-radhard PIC, to reduce parasitic bipolar gain.

7. The process of claim 3, further comprising the step of forming implant layers in the control segment for raising parasitic MOSFET thresholds with respect to native MOSFET thresholds.

8. The process of claim 3, further comprising reducing CMOS drain to source leakage and device to device leakage by laying out a poly gate to field oxide overlap and by individually ringing all CMOS devices with channel adjust layers.

9. A process for the manufacture of a power integrated circuit having improved total dose radiation resistance and resistance to single event failure, the method comprising the sequentail steps of:

forming an epitaxial layer on a substrate;

introducing and diffusing dopants into an upper surface of the epitaxial layer to isolate a control segment and a power segment;

introducing and diffusing dopants into the upper surface of the isolated control and power segments to form a plurality of diffused regions in control and power segments, thereby forming channel regions; and thereafter forming a gate insulation layer over at least the channel regions, so as to provide a power integrated circuit for use in high ionizing radiation environments.

10. The process of claim 9, wherein the step of forming an epitaxial layer comprises forming a dual epitaxial layer having a higher concentration layer at a junction with the substrate.

11. The process of claim 9, further comprising the step of forming implant layers in the control segment for raising parasitic MOSFET thresholds with respect to native MOSFET thresholds.

12. The process of claim 9, further comprising the step of forming a radhard field oxide.

13. The process of claim 12, wherein the step of forming a radhard field oxide includes depositing undoped oxide on top of a thin thermally grown oxide.

14. The process of claim 12, wherein the radhard field oxide is a layer having a thickness of about 8000 Å.

15. The process of claim 1, wherein the diffusion regions are formed by diffusing implanted dopants at high temperatures greater than or equal to about 1,000° C.

16. A process for the manufacture of a power integrated circuit having improved total dose resistance and resistance to single event failure, the process comprising the steps of forming gate oxides after forming active area diffusion regions in a voltage junction isolation process, thereby avoiding exposure of the gate oxides to implant diffusion processing steps that degrade total ionizing dose resistance and providing a power integrated circuit for use in a high ionizing radiation environment.

* * * * *